United States Patent
Schoeppach et al.

(10) Patent No.: US 9,604,299 B2
(45) Date of Patent: Mar. 28, 2017

(54) METHOD AND DEVICE FOR CONNECTING AN OPTICAL ELEMENT TO A FRAME

(71) Applicant: Carl Zeiss SMT GmbH, Oberkochen (DE)

(72) Inventors: Armin Schoeppach, Aalen (DE); Johnannes Rau, Gerstetten (DE); Gennady Fedosenko, Aalen (DE); Leonid Gorkhover, Ulm (DE); Gerd Klose, Tokyo (JP); Stefan Wiesner, Lauchheim (DE); Hans-Joachim Trefz, Backnang (DE); Michael Widmann, Aalen (DE); Ulrich Bingel, Michelfeld (DE); Claudia Ekstein, Ellwangen (DE); Guenter Albrecht, Gerstetten (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 282 days.

(21) Appl. No.: 14/199,044

(22) Filed: Mar. 6, 2014

(65) Prior Publication Data
US 2015/0008215 A1    Jan. 8, 2015

Related U.S. Application Data

(63) Continuation of application No. 12/403,972, filed on Mar. 13, 2009, now Pat. No. 8,705,006, which is a
(Continued)

(30) Foreign Application Priority Data

Oct. 24, 2006 (DE) .................. 10 2006 050 653

(51) Int. Cl.
*G02B 7/02* (2006.01)
*B23K 1/005* (2006.01)
(Continued)

(52) U.S. Cl.
CPC .......... *B23K 1/0056* (2013.01); *B23K 1/0008* (2013.01); *G02B 7/02* (2013.01);
(Continued)

(58) Field of Classification Search
CPC ...... B23K 1/0056; B23K 1/0008; G02B 7/02; G02B 7/025; G03F 7/70825; Y10T 156/10
(Continued)

(56) References Cited

U.S. PATENT DOCUMENTS 3,297,392 A    1/1967  Ballmer
4,457,467 A    7/1984  Klement et al.
(Continued)

FOREIGN PATENT DOCUMENTS

DE    27 05 568    8/1978
DE    31 37 441    3/1983
(Continued)

OTHER PUBLICATIONS

The International Preliminary Report on Patentability for the corresponding PCT Application No. PCT/EP2007/009177, filed Oct. 23, 2007.
(Continued)

*Primary Examiner* — Scott J Sugarman
*Assistant Examiner* — Mustak Choudhury
(74) *Attorney, Agent, or Firm* — Fish & Richardson P.C.

(57) ABSTRACT

A method and a device for the material-fit connection of an optical element to a frame are disclosed.

22 Claims, 6 Drawing Sheets

Related U.S. Application Data continuation of application No. PCT/EP2007/009177, filed on Oct. 23, 2007.

(60) Provisional application No. 60/862,618, filed on Oct. 24, 2006.

(51) Int. Cl.
  *G03F 7/20* (2006.01)
  *B23K 1/00* (2006.01)

(52) U.S. Cl.
  CPC ......... *G02B 7/025* (2013.01); *G03F 7/70825* (2013.01); *Y10T 156/10* (2015.01)

(58) Field of Classification Search
  USPC ............ 359/811, 819, 820, 822; 219/121.64; 355/67, 77
  See application file for complete search history.

(56) References Cited

U.S. PATENT DOCUMENTS

| | | | |
|---|---|---|---|
| 4,469,929 A | 9/1984 | Rosen et al. | |
| 4,859,807 A | 8/1989 | Swiggett et al. | |
| 5,008,705 A | 4/1991 | Sindledecker | |
| 5,991,101 A * | 11/1999 | Holderer | C03C 27/046 359/819 |
| 6,392,824 B1 | 5/2002 | Holderer et al. | |
| 6,392,825 B1 * | 5/2002 | Trunz | G03F 7/70825 359/811 |
| 6,627,847 B1 | 9/2003 | Hu et al. | |
| 7,015,558 B2 | 3/2006 | Takano et al. | |
| 7,286,307 B2 | 10/2007 | Yamamoto et al. | |
| 7,558,453 B2 | 7/2009 | Steegmuller et al. | |
| 8,705,006 B2 | 4/2014 | Schoeppach et al. | |
| 2002/0140094 A1 | 10/2002 | Kubota et al. | |
| 2003/0178403 A1 | 9/2003 | Lemmerhirt et al. | |
| 2004/0157143 A1 | 8/2004 | Taniguchi | |
| 2004/0245228 A1 | 12/2004 | Liu et al. | |
| 2005/0110973 A1 | 5/2005 | Streefkerk et al. | |
| 2005/0213066 A1 | 9/2005 | Sumiyoshi | |
| 2006/0055909 A1 | 3/2006 | Fiolka et al. | |
| 2006/0124614 A1 * | 6/2006 | Rossopoulos | B23K 1/0056 219/121.64 |
| 2006/0191215 A1 * | 8/2006 | Stark | C03C 27/08 52/204.6 |
| 2007/0075057 A1 | 4/2007 | Chen et al. | |
| 2007/0090156 A1 | 4/2007 | Ramanathan et al. | |
| 2009/0244508 A1 | 10/2009 | Schoeppach et al. | |

FOREIGN PATENT DOCUMENTS

| | | |
|---|---|---|
| DE | 31 38 296 | 4/1983 |
| DE | 35 34 366 | 4/1987 |
| DE | 37 19 382 | 12/1988 |
| DE | 37 29 410 | 3/1989 |
| DE | 40 34 010 A1 | 5/1991 |
| DE | 41 139 56 | 11/1992 |
| DE | 197 35 760 | 2/1995 |
| DE | 197 55 356 | 6/1999 |
| DE | 102 28 054 | 1/2004 |
| DE | 10 2004 02475 | 12/2005 |
| DE | 10 2004 03809 | 12/2005 |
| DE | 10 2004 03654 | 3/2006 |
| EP | 0 999 729 | 5/2000 |
| EP | 1 026 532 | 8/2000 |
| JP | 62-293213 | 12/1987 |
| JP | 01-158406 | 6/1989 |
| JP | 01-215745 | 8/1989 |
| JP | 01278987 | 11/1989 |
| JP | 3126003 | 5/1991 |
| JP | 11-228192 | 8/1999 |
| JP | 2003-066301 | 3/2003 |
| JP | 2003-107309 | 4/2003 |
| JP | 2003-195138 | 7/2003 |
| JP | 2004-325595 | 11/2004 |
| JP | 2004 325595 | 11/2004 |
| JP | 2005-037444 | 2/2005 |
| JP | 2005-300621 | 10/2005 |
| JP | 2005 316045 | 11/2005 |
| JP | 2005-345654 | 12/2005 |
| JP | 2006-066836 | 3/2006 |
| JP | 2006-162979 | 6/2006 |
| JP | 2006-201415 | 8/2008 |
| WO | WO 2005/101121 | 10/2005 |
| WO | WO 2005/103788 | 11/2005 |
| WO | WO 2005/111687 | 11/2005 |

OTHER PUBLICATIONS

Japanese Office Action, with English translation, for corresponding JP Appl No. 2009-533714, dated Mar. 16, 2012.
Japanese Office Action, with translation thereof, for corresponding JP Appl No. 2009-533714, dated Mar. 12, 2013.
Translation for JP 2004-325595 published in 2004.

* cited by examiner

METHOD AND DEVICE FOR CONNECTING AN OPTICAL ELEMENT TO A FRAME

CROSS-REFERENCE TO RELATED APPLICATIONS

This application is a continuation of, and claims benefit under 35 USC 120 to, U.S. application Ser. No. 12/403,972, filed Mar. 13, 2009, which is a continuation of, and claims priority under 35 USC 120 to, international application PCT/EP2007/009177, filed Oct. 23, 2007, which claims benefit of German Application No. 10 2006 050 653.7, filed Oct. 24, 2006 and U.S. Ser. No. 60/862,618, filed Oct. 24, 2006. U.S. application Ser. No. 12/403,972 and international application PCT/EP2007/009177 are hereby incorporated by reference.

FIELD

The disclosure relates to a method and a device for the material-fit connection of an optical element to a frame.

BACKGROUND

Methods for connecting optical elements to frames are known.

SUMMARY

In some embodiments, the disclosure provides a method and a device, by which an optical element and a frame can be connected together harmlessly and with reduced drift of the two assembly partners.

In certain embodiments, the disclosure provides a material-fit connection of an optical element to a frame. A connection medium is melted locally on at least one connection position between the optical element and the frame. The optical element and the frame is in mechanical contact with one another at each instant in the connection process on at least three connection positions through non-molten regions of the connection medium. In other words, the optical element rests on the frame during the connection process on at least three positions through non-molten parts of the connection medium which is provided. The effect achieved by this is that the orientation of the optical element in relation to the frame is defined at each instant in the connection process, since floating of the optical element on a fully molten region of the connection medium cannot take place. The non-molten regions of the connection medium are therefore are used during the connection process as positioning aids in the manner of a holding template by which the relative position of the two assembly partners, i.e. the optical element and frame, is constantly defiant. The disclosure can therefore allow highly accurate and reproducible assembly of the optical element and the frame.

For example, the optical element and the frame may be connected together on at least four connection positions, in a first step energy input being carried out on at least three of the at least four connection positions so that a non-molten region of the connection medium remains during the energy input on the relevant connection position, through which the optical element is in mechanical contact with the frame. The non-molten regions of the connection medium are thus used as supports for the optical element relative to the frame; the described partial melting of the connection medium on the first at least three connection positions may also be referred to as a fixing process or as attachment. Subsequently, in a further step, the optical element and the frame are connected together by fully melting the connection medium on the individual connection positions in succession.

If for example a circular optical element is selected as the optical element, for example a lens, then the three positions which are subjected to the fixing process in the first step may be arranged at an angular spacing of about 120° along the circumference of the lens, so as to obtain particularly stable mounting and positioning of the lens relative to that frame during the fixing process and the subsequent connection process.

The connection medium may in particular designed as a solder preform with a thickness of about 50 µm to 100 µm and lateral dimensions of about 5×5 mm; it is however also conceivable for the connection medium to be vapor deposited, sputtered or electrolytically applied onto the optical element and/or the frame as a coating in the region of the connection position.

A laser beam with a power of about 100 watts may advantageously be used for melting the connection medium. In this case, the fixing process of the first step may be achieved by illuminating the connection position for about 50 milliseconds with a laser spot with a size of 1 mm$^2$.

For example, tin-based solders such as SnAg4, tin-lead solders, solders containing bismuth such as BiSn42, solders containing indium, solders containing antimony, gold-based solders and solders containing gold, silver or palladium are suitable as the connection medium.

The full melting of the connection medium in the subsequent step may, for example, be achieved by employing a controlled soldering process while monitoring the temperature of the connection position—in particular by using a pyrometer.

In particular lenses or mirrors, for example of a projection exposure apparatus for semiconductor lithography, may be envisaged as optical elements.

With the method described above, it is possible in particular to produce a projection exposure apparatus for semiconductor lithography in which there is an optical element arranged in a frame with a material fit via a connection medium, the optical element being in mechanical contact with the frame only through the connection medium. In other words, the optical element does not rest directly on the material of the frame at any position.

This type of framing technique is suitable in particular for thin-edged lenses for example with an edge thickness of less than 1 cm, but also for mechanically manipulable lenses or even a first or last lens in a projection objective of the projection exposure apparatus in the beam direction. In the case of an EUV projection exposure apparatus, the optical element may also be a non-mechanically manipulated mirror of the apparatus; such mirrors are conventionally exposed to high thermal loads in EUV projection exposure apparatus.

In some embodiments, the optical element is connected to the frame on at least one connection position via a connection medium containing at least one metallic component. The optical element and the frame are mutually positioned before the connection in order to avoid relative movements during the connection, and the positioning being carried out indirectly or directly by at least one bearing element which is designed as part of the frame. This measure can prevent a liquid layer of an adhesive, cement, liquid metal, solder or the like from being formed between the optical element and the frame during the connection process, on which the optical element floats and therefore changes its position relative to the frame. The optical element therefore remains connected to the frame through a rigid support during the connection process, and the selected relative position is reliably maintained.

The frame and the at least one bearing element may, for example, be designed integrally; an option includes connecting the frame and the at least one bearing element releasably, for example connecting them together by screwing. The effect of the latter procedure is that the bearing element can be removed from the frame after the connection process. The advantages of this procedure are in particular that, after the at least one bearing element has been removed from the frame, the number of contact positions of the optical element with the frame is reduced and the risk of for example thermally induced stresses in the optical element during its use is therefore substantially reduced. Another advantage of the method is that the installation space desired for the combination of the frame and optical element is considerably reduced, which is very important for installation space-critical applications, for example for projection exposure apparatus and in particular objectives for semiconductor lithography, in which the optical elements framed by the method may advantageously be employed.

It has been found advantageous for the optical element to rest on the at least one bearing element on at least three points. Mounting on three points satisfies the desired properties for stable mounting of the optical element in the frame. Mounting on an edge may also be envisaged.

An advantageous method for material-fit connection of the optical element to the frame consists in employing a soldering method, in particular by using a flux-free solder alloy. In some embodiments, the solder may be applied beforehand onto the frame and/or the optical element as a layer. For example PVD, CVD, electrolytic or chemical methods may be envisaged as coating methods. The solder may likewise be applied as a molten coating. In particular tin-based solders (for example SnAg4), tin-lead solders, solders containing bismuth such as BiSn42, solders containing indium, solders containing antimony, gold-based solders and solders containing gold, silver, palladium may be envisaged.

In certain embodiments the solder may be applied as a preform on the frame and/or on the optical element before the connection process. The preform may advantageously be produced by stamping it from a foil; in this case, suitable shaping of the preform and frame or the optical element can achieve the additional advantageous effect that the preform is aligned straightforwardly on the frame or the optical element. This may for example be ensured by providing mutually corresponding position markers on the preform and frame, or the optical element.

Particularly when using a preform stamped from a foil, it has been found advantageous to configure the frame in the region of the connection position so that it follows the geometrical shape of the optical element. Assuming a constant thickness of the preform, this provides a gap with an approximately constant thickness between the preform and the optical element. The thickness of the gap may tend toward zero; in this case, however, it is usually desired to ensure that the optical element rests on the at least one bearing element and not on the preform.

Optionally, a method may be envisaged in which the optical element rests on the preform at the bearing points; the mutual position of the optical element and the frame is in this case defined by the optical element-preform-bearing element arrangement. In this case as well, it is possible to keep the mutual position of the elements constant during the soldering process. To this end, it is merely desired to ensure that the preform is only melted locally during the soldering process, i.e. specifically not in the region of the bearing point. For example a solder platelet, which is melted only pointwise or in regions during the soldering process, may be used as a preform. This can reliably prevent the optical element from floating on the preform during the soldering process. This variant has the particular advantage that comparatively simple preforms can be used.

In the variant explained above, as already mentioned, the position of the optical element relative to the bearing element is also dictated essentially by the platelet thickness. If the platelet is only melted pointwise or in regions, for example by a laser beam, then the orientation of the optical element relative to the bearing element is co-defined by the platelet thickness. In this case as well, the positioning of the optical element relative to the bearing element is defined through a form fit, specifically by an indirect form fit due to the platelet. Only when the platelet is melted throughout the bearing region between the optical element and the bearing element does the positioning of the optical element relative to the bearing element take place no longer by a form fit but by material fit, the "positioning accuracy" being determined essentially by the thickness of the platelet.

In order to improve the strength of the solder connection, it has proven expedient to apply a solderable layer system on the optical element, which may in particular be produced as a metallization layer in the region of the connection position. Different variants may be envisaged in respect of the configuration of the metallization layer. One aspect in the configuration of the metallization layer is that the heating of the solder and the connection position on the holder and the optical element can be carried out via a laser beam, in particular by using an IR or UV-VIS laser. A first possibility consists in heating the solder through the optical element and the metallization layer. For this procedure, it is advantageous to configure the metallization layer not as a continuous layer of constant thickness, but to provide it with openings, or not to bound to the metallization layer by sharp edges. This will ensure that a sufficiently large part of the energy of the laser beam reaches the solder, in order to liquefy it.

In certain embodiments, the laser beam is reflected at least partially by the other side of the solderable layer system from the optical element, and in the reflected fraction heating the solder. This procedure has the particular advantage that the absorption properties of the optical element do not have to be taken into account when selecting the laser. It furthermore avoids damage of the optical element due to the energy introduced into it by the laser beam being used.

In order to further increase the quality of the solder connection, the frame may be heated by an additional laser beam in the region of the connection position. The first and additional laser beams may come from the same laser source, for example having been separated by a beam splitter. Optionally, the additional laser beam may come from an additional laser source; this provides the opportunity to select the additional laser beam in accordance with the features of the frame, for example its absorption properties.

The occurrence of intrinsic solder stresses or other stresses in the region of the connection position may be achieved by reducing the laser power in a controlled way after the soldering process per se, so that the energy input per unit time decays gradually. As an alternative or in addition, the stresses may also be relaxed by subsequent heat treatment of the arrangement.

In some embodiments, the at least one bearing element is in contact with the optical element in the region of an optically active surface of the optical element, and the connection position lies on an optically inactive surface of the optical element. An "optically active surface" is intended to mean a surface of the optical element which transmits or receives light during use of the optical element. In the case of a lens as the optical element, the optically inactive surface is intended to mean the cylinder edge of the lens.

An advantageous possibility for connecting an optical element to a frame involves initially applying a metal layer onto the optical element and subsequently connecting a region of the metal layer on the other side from the optical element to the frame with a material fit.

In particular, a welding method may be used as the connection method. One advantage of this procedure is that only the part of the metal layer next to the frame is melted during the welding, while the part of the metal layer next to the optical element remains solid. The entire welding process may take place within milliseconds—in which case the part of the frame adjoining the metal layer likewise melts. For the duration of a laser pulse used for example in the scope of a laser welding method, values of about 10 ms or about 0.5 s to 5 s are advantageous. A permanent connection is therefore obtained within an extremely short time. The effect achieved by this is that the part of the layer in contact with the optical element is affected only minimally by the welding process. The duration of the energy supply and therefore the heat influence zone are very much smaller than for example compared with a laser soldering method, since for example a single short laser pulse is generally sufficient to join the assembly partners together when using a laser welding method. In particular, the temperature on the non-metallic material of the optical element can therefore be kept much lower than 100° C. (e.g., in the range of about 40° C.) especially since the weld point which is very much smaller compared with a solder position solidifies much more rapidly than a solder connection; usually, the weld point will solidify more rapidly than the assembly partners can heat up. The metal layer with a thickness furthermore leads to effective mechanical decoupling of the weld position from the optical element. The risk of introducing both thermal and mechanical loads into the optical element is therefore effectively minimized. Furthermore, the increased process reliability when using a welding method compared with a soldering method has a positive effect. In particular the desire to prevent the formation of an oxide layer for example by fluxes, which constantly exists in soldering methods, plays only a secondary role or no role at all in welding methods. A welding process furthermore obviates the need to deposit an auxiliary material, for example solder, under cleanroom conditions on the connection position between the frame and the optical element, which is often problematic in terms of handling. In contrast to conventional soldering methods, the method can make it possible to apply the metal layer onto the optical element long before the connection process; it therefore becomes an unlosable component thereof—because it is firmly connected to the optical element—so that the process reliability and the manageability are further increased, for example in a cleanroom environment.

Furthermore, it is not necessary to coat the frame before the connection operation, so that the connection process is kept simple and therefore economical.

The described welding process is also advantageous in terms of energy, since the energy is only introduced at the positions in the material where it is needed.

Another advantage is that the risk of position changes during the connection process is significantly reduced owing to the small volume which is melted. The position of the optical element relative to the frame can therefore be adjusted much more precisely, and also maintained during the connection process.

About 0.3-2 mm has proven to be an advantageous value for the thickness of the metal layer; the diameter of the weld point may be selected in a range of about 0.1-1.5 mm.

Optionally, a brazing method can be used. A brazing method is distinguished in that merely one of the parts to be connected is melted, for example only a part of the metal layer, while the frame is not melted.

In some embodiments, the metal layer lies on an optically inactive surface of the optical element. An "optically inactive surface" is intended to mean a surface of the optical element which transmits or receives light during use of the optical element. In the case of a lens as the optical element, the optically inactive surface is intended to mean the cylinder edge of the lens. This measure has the advantage that the optical element can be processed further, in particular cleaned or coated, even after the metal layer is applied.

A low-melting or soft alloy represents an advantageous selection for the metal layer. The effect achieved by this is that a lower energy input is desired for connecting the optical element and the frame, so that the temperatures occurring on the optical element can be kept low and stresses occurring can be relaxed by a plastic deformation of the soft metal layer during cooling. Another effect of suitable selection of the material of the metal layer is that the optical element can more easily be removed again from the frame.

Another option for a method for the material-fit connection of an optical element to a frame via a connection material consists in melting the connection material at least partially by short-term energy input. The energy input may be carried out by supplying a power of about 50 W for a period of less than 3 s. This procedure has the advantage that it leaves only to local heating and therefore to only local deformation, and therefore less change in the shape and position of the optical element and the frame. The energy input may be carried out by electromagnetic radiation such as light, in particular lasers, microwaves, or inductively.

A soldering method may advantageously be used for connecting the two assembly partners, in which case the solder used for the soldering may be applied as a powder or paste before the connection process; another possibility consists in applying the solder by a coating method, for example a PVD or CVD method, a chemical or electrolytic method or as a molten coating.

It has been found particularly advantageous to apply the solder used for the soldering as a preform before the connection process, for example with a thickness of about 100 μm. In particular, this measure achieves increased position stability and retention holding during the connection process compared with the prior art, as well as improved alignability before the connection process. This procedure also results in simple application and fixing of the solder.

In some embodiments, the optical element resins are the bearing points on the preform; the mutual position of the optical element and the frame is defined in this case by the optical element-preform-frame arrangement. In this case as well, it is possible to keep the mutual position of the elements constant during the soldering process. To this end, it is merely desired to ensure that the preform is only melted locally during the soldering process, i.e. specifically not in the region of the bearing point. This can reliably prevent the optical element from floating on the preform during the soldering process. This variant has the particular advantage that comparatively simple preforms can be used.

In order to fix the preform on the frame, it has proven expedient for the frame to include a bearing foot with a recess to receive the preform; the recess may, in particular, be designed as a groove at least approximately in the form of a circle arc segment, or as an at least approximately cylindrical hole.

An advantageous selection for the placement of the connection position is for it to lie on an optically inactive surface of the optical element. An "optically inactive surface" is intended to mean a surface of the optical element which transmits or receives light during use of the optical element. In the case of a lens as the optical element, the optically inactive surface is intended to mean the cylinder edge of the lens. This measure has the advantage that the optical element can be processed further, in particular cleaned or coated, even after the metal layer is applied.

The quality of the connection position may be improved by the preform, and the region of the frame which is in contact with the preform, being designed in such a way that the preform is pressed against the optical element by a spring force. The preform itself, the part of the frame which is in contact with the preform, may be designed as a resilient element.

In some embodiments, an optical element is connected to a frame via a holding element on at least one connection position consists in a recess, into which the holding element is introduced, being formed in the optical element in the region of the connection position, and regions in the recess between the holding element and the optical element being filled by a filler material. The filler material may be a molten material which is introduced into the recess in the molten state, after the holding element has been introduced into the recess, into the region between the holding element and the recess where it cools and solidifies. In this way, at least a form-fit connection can be produced without precise preparation of the recess and the holding element being involved. A material fit is not necessary in this first variant. The mechanical stability of the arrangement including the optical element and the frame may be improved further by introducing a connection material, in particular a solder or an adhesive, into the recess in the optical element in order to form a material-fit connection.

An advantageous soldering process may, in particular, be carried out by initially applying a metallization layer applied via an electrolytic method on at least one of the assembly partners to be connected and subsequently melting the metallization layer, the metallization layer containing at least one admixture for improving the properties of the solder position, for example increasing its mechanical stability. The term mechanical stability is intended to mean all properties of the solder position which affect the robustness of the solder position in relation to mechanical stresses such as tension, compression or shear. Furthermore, mechanical stability is also meant to be a small influenceability of the mechanical properties of the solder position by temperature variations. It is also conceivable to provide the two assembly partners respectively with different electrolytically applied metallization layers before the actual soldering process. Electrolytic application of the metallization layer is not compulsory in this case; the solder may be applied in another way into the region of the connection position, for example as a preform.

In this way, it is possible to counter effectively the conflict of interests that the low-melting metals used for the soldering are comparatively soft, for example In or Sn, and therefore susceptible to creep in the long term. On the other hand, the use of low-melting metals is virtually inevitable since heating the sensitive optical components to temperatures higher than desired for a soldering process entails considerable risks. The mechanical properties of the solder connection may be improved in particular by using dispersoids, in particular oxides, nitrides, borides or carbides; furthermore, a reduction in the thermal expansion coefficient of the solder connection may also be achieved if the dispersoid is a zerodur powder.

The formation of an intermetallic phase in the region of the solder position, in particular by using phosphorus, or the use of microfibers or nanotubes, is also advantageous. In particular, the mechanical properties of carbon nanotubes may be used advantageously for this; they have a density of 1.3-1.4 $g/cm^3$ and a tensile strength of 45 billion pascals, and therefore a ratio of tensile strength to density which is about 135 higher than for example steel.

The above-described configurations of the connection position and the bearing elements may also be used advantageously in cases in which the connection material is melted not by short-term but by prolonged energy input. In particular, the described methods for the material-fit connection of a frame and an optical element may also be combined with the variants mentioned in detail above and below for configuration of the bearing elements and the connection positions.

BRIEF DESCRIPTION OF THE DRAWINGS

Exemplary embodiments of the disclosure, which differ in principle, will be described below with the aid of the drawing, in which:

FIG. 12a-12d shows a configuration of holding elements.

DETAILED DESCRIPTION

Figure 1:
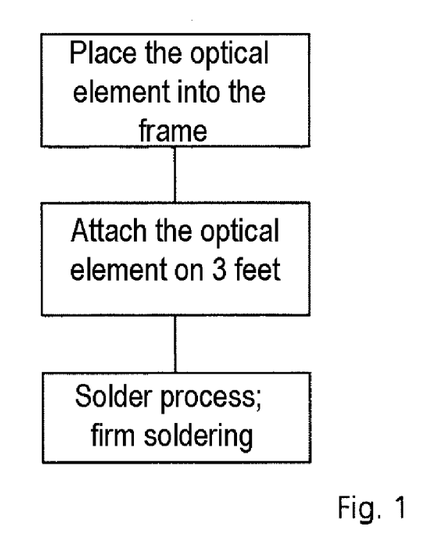
FIG. 1 shows a flow chart of a method.

FIG. 1 represents the disclosure by way of example with the aid of a flow chart. First, an optical element to be soldered into a frame is placed into the frame; the frame has a multiplicity of so-called bearing feet, on which the optical element is mounted. The bearing feet may be screwed onto the frame or connected integrally with the frame. Solder preforms, designed as platelets, are arranged between the bearing feet and the optical element. The platelets are about 50 to 100 µm thick and have a lateral extent of about 5×5 mm. They are made of the materials mentioned above. As an option in designing the solder preforms as platelets, it is also possible to coat either the bearing feet or the optical element with the connection material. This coating may for example be carried out by vapor deposition, sputtering or an electrolytic method. It is advantageous to coat the optical element beforehand on the positions to be brought in contact with the bearing feet, since this gives better thermal contact during the subsequent soldering process so that it is possible to operate with a shorter or weaker laser pulse. This means that heating of the bearing feet can be minimized as much as possible, and it reduces the risk of thermal deformations of the bearing feet during the soldering process or due to the soldering process. After the optical element has been placed onto the bearing feet, temporary attachment of the optical element takes place on three bearing feet. To this end, the preform is exposed to an Nd:YAG laser with a power of about 100 watts through the optical element, and is thereby heated. A laser pulse with a length of about 50 ms is sufficient for the fixing process; it is to be assumed that 40-60 watts of the 100 watt laser output power input into the position to be soldered, owing to surface reflections and scattering. It is advantageous for the three bearing feet, on which it is fixed, to be selected with an angular spacing of about 120° in order to ensure maximally stable mounting of the optical element. Other distributions of the fixing positions may also be envisaged.

The actual soldering process subsequently takes place, i.e. the individual solder positions are firmly soldered in succession. To this end a controlled soldering process is employed, i.e. the surface temperature of the solder position is monitored by a pyrometer. A heating process is initially carried out with a linearly increasing laser power for about 0.5 s. As soon as the holding temperature of about 200 to 250° C. (in the case of a bismuth-tin solder) is reached, the laser power is kept constant for about 2 s. The laser power is then reduced to 0 over a period of about 0.5 s. When using a silver-tin solder, the holding temperature is about 300° C. In order to reinforce the process, the solder may be supplemented with a flux which on the one hand reduces the surface tension of the liquid solder and therefore improves the mechanical contact, and on the other hand reduces the surfaces oxidized during the soldering process. For example water-based or alcohol-based, halogen-free fluxes may be suitable.

During the fixing process, the size of the laser spot being used is in the range of about 1 mm$^2$, while a spot size which is matched to the size of the solder preform is selected for the actual soldering process. This may, for example, be achieved by using suitable optics and/or by selecting the distance from the light output surface of the laser to the solder position. The described method is suitable in particular for optical elements which are particularly stressed mechanically, thermally or chemically, for example in a projection objective for semiconductor lithography. The described process may advantageously be employed in particular for framing entry lenses or exit lenses of the projection objective, but also for mechanically manipulated optical elements. In EUV objectives, non-manipulated mirrors are particularly suitable for the soldering process owing to the high heat loads to be expected.

Figure 2:
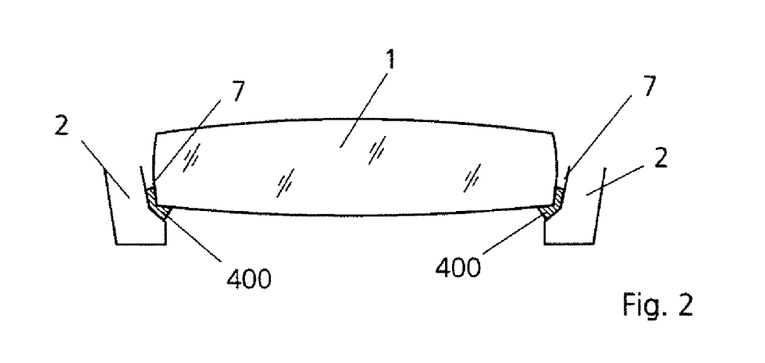
FIG. 2 shows a framed optical element.

FIG. 2 shows an optical element 1 framed in a frame 2. The optical element 1 is arranged in frame 2 so that it is mechanically connected to the frame 2 at the connection positions 7 only through the connection medium 400. This type of framing technique is made possible by using the method according to the disclosure, since it ensures precise soldering of the optical element 1 into a frame 2. A particular advantage of the framing technique represented in FIG. 2 is that the optical element 1 is connected to the frame 2 through a uniform material system. In this way, inter alia, the occurrence of mechanical stresses due to temperature variations is effectively reduced, which is advantageous in particular for use of the optical element framed in a projection exposure apparatus for semiconductor lithography.

Figure 3:
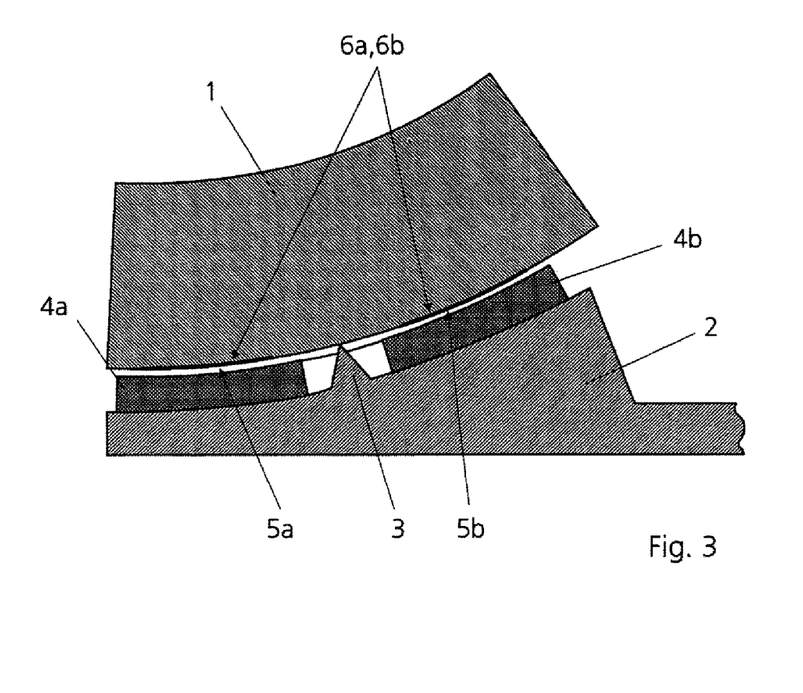
FIG. 3 shows mounting of the optical element.

FIG. 3 shows details of the region of the connection position of the optical element 1 and the frame 2. The optical element 1 rests on the frame 2 via the bearing element 3, which is produced in the present example as roof-like projection formed integrally with the frame 2. The two preforms 4a and 4b are arranged on the frame 2 in the vicinity of the bearing element 3. The preforms 4a and 4b are matched to the form of the frame 2 in respect of their geometrical shape, for example being stamped from a foil of suitable thickness. Since the frame 2 is already matched to the geometrical shape of the optical element 1 in the region of the connection position, a gap 5a,b with a constant thickness is obtained between the optical element 1 and the preforms 4a and 4b owing to the constant thickness of the preforms 4a and 4b. The metallization layers 6a and 6b are respectively applied onto the surface regions of the optical element which correspond to the preforms 4a and 4b. If the two preforms 4a and 4b are now heated, for example by the action of a laser beam, then they melt and contract owing to the surface tension of the molten material, so that the gaps 5a and 5b are closed and a material-fit connection is consequently produced between the optical element 1 and the frame 2. The position of the optical element 1 relative to the frame 2 does not change because the position is already fixed during the connection processed by the bearing element 3, and the melting preforms 4a and 4b do not lead to floating and therefore a position change of the optical element 1 relative to that frame 2.

Figure 4:
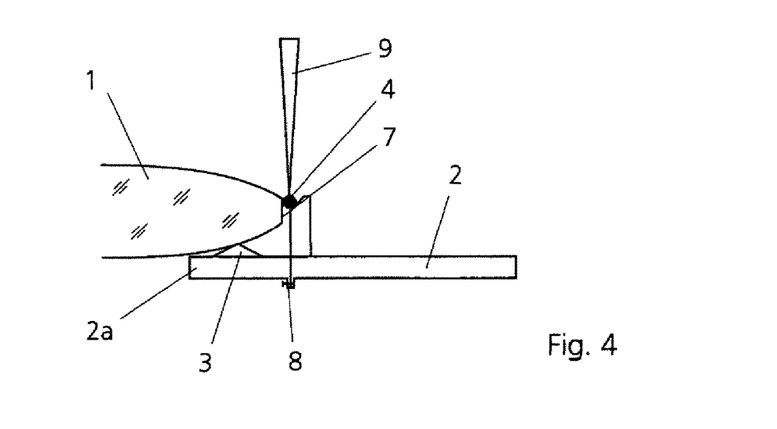
FIG. 4 shows a device.

FIG. 4 shows an embodiment of the device employed for a method. In some embodiments, the optical element 1 designed as a lens is connected to the frame 2 so that the connection position 7 of the optical element 1 to the frame 2 lies on an optically inactive surface of the optical element 1. In the present case, this is achieved by the connection position 7 lying on the cylinder edge of the lens 1. The spherical preform 4 is fixed in the embodiment shown in FIG. 4 by its lying between the cylinder edge of the lens 1 and a chamfered region of the frame 2 and being held in its position by the force of gravity. The bearing element 3 is designed in the present case as part of an additional holding element 2a temporarily fixed on the frame 2 by a screw connection 8. After the preform 4 has been liquefied by the focused laser beam 9 and the material-fit connection between the optical element 1 and the frame 2 has been produced, the additional holding element 2a can be removed from the frame 2 by releasing the screw connection 8. The optical element 1 is then held in the frame 2 only by the material-fit solder connection and the risk of additional, for example thermally induced, stresses which are due to the holding elements that are no longer required after the connection, is effectively reduced by this solution.

Figure 5:
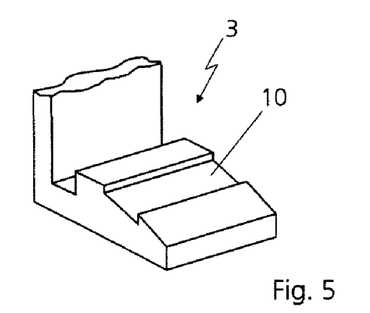
FIGS. 5 and 5a shows a bearing element.
Figure 5A:
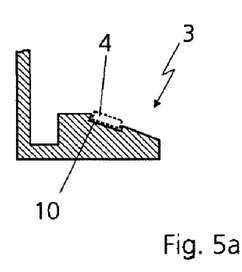

FIG. 5 shows an advantageous embodiment of a bearing element 3. The bearing element 3 has a slot-shaped indentation 10. Such an indentation may, for example, be produced by initially machining the indentation 10 from the solid material of the frame and subsequently excavating the bearing element 3 which is formed from the material of the frame 2, for example by a sawing. The slot-shaped indentation 10 may be used to receive a solder preform 4, as depicted as a cross-sectional representation in FIG. 5a.

Figure 6:
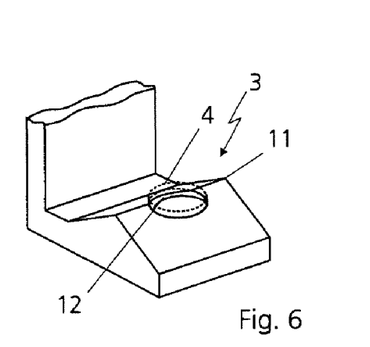
FIGS. 6 and 6a shows a bearing element having a bore for receiving a solder preform.

A configuration of a bearing element 3 is shown by FIG. 6. The bearing element 3 is configured so that it has a so-called roof edge 11, on which the optical element 1 can be mounted. A cylindrical bore 12 may extend over the roof edge 11. The bore 12 may, in particular, receive a correspondingly shaped preform 4.

The effect of this measure is that the material-fit connection of the optical element 1 to the bearing element 3 fulfils the function of holding the optical element 1, the positioning of the optical element 1 being carried out or defined by a form fit. In other words, there is at least one bearing surface (or at least a bearing point or a bearing line) on the bearing element 3, which is in direct (immediate) contact with the optical element 1 and therefore forms a pure form fit with respect to the positioning of the optical element 1. In other regions of the bearing element 3, a material fit is additionally produced through the soldering via the preform 4. It should be taken into account here that during production of the material-fit connection, local stresses which act on the optical element 1 may occur owing to some shrinkage of the solder when it solidifies. In order to absorb such stresses as uniformly as possible, the bearing element 3 optionally has a symmetrical roof edge 11 (symmetrical with respect to the material-fit connection position). Depending on the size of the optical element 1 and the size of the bearing element 3, the roof edge 11 may also be replaced by a flat support. The flat support is in this case optionally arranged symmetrically with respect to the position of the material-fit connection and therefore symmetrically with respect to the preform 4.

Besides flat or linear support, it is also possible for the bearing to take place in an essentially point-like fashion, for example by providing the edge (or surface) arranged to the left and right of the preform 4 with additional bearing points.

Figure 6A:
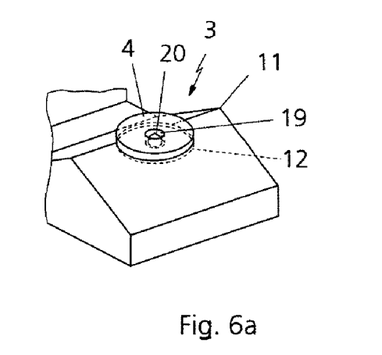

FIG. 6a shows a variant of the disclosure, slightly modified relative to the embodiment represented in FIG. 6, in which the optical element 1 rests on the bearing element 3 via a point-like support, the form fit between the optical element 1 and the bearing element 3 being produced by the point-like support. This may for example be achieved, as in FIG. 6a, by the preform 4 having a bore 19 through which a pin 20 connected to the bearing element 3 projects, the pin being provided with a tip in the direction of the optical element 1. The pin height is in this case matched to the height of the preform 4. The pin 20 optionally has approximately the same height as the preform 4, so that no solder wets the pin tip when the solder is melted, and so that a material-fit connection is still produced between the solder and the optical element 1, although the optical element 1 is mounted in a defined way in respect of its position by the pin 20.

Figure 7:
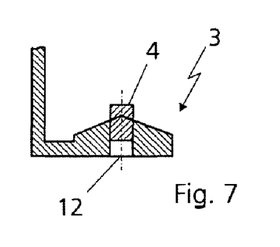
FIG. 7 shows a bearing element having a vertical through-bore.

As represented in FIG. 7, the bore 12 is configured so that it extends in the vertical direction through the entire bearing element 3. This variant has the advantage that the preform 4 can be inserted from below through the bore 12 into the bearing element 3.

Figure 8:
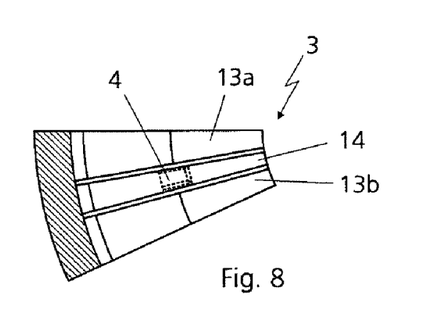
FIG. 8 shows a bearing element having a resilient element for fixing a solder preform.

FIG. 8 represents another variant of the bearing element 3. The bearing element 3 is divided into three subregions, of which the two outlying subregions 13a and 13b are designed in a way comparable to that represented in FIGS. 6 and 7. The central subelement 14 is produced as a resilient tongue. This variant has the particular advantage that a solder preform 4 arranged on the resilient tongue 14 is pressed in the direction of the optical element 1 by the spring force exerted by the tongue 14, and the material fit during the soldering is therefore optimally ensured. In this procedure, it is advantageous for the spring force of the resilient element 14 to be dimensioned so that the force exerted on the optical element from below through the preform 4 is less than the weight force of the optical element 1 respectively acting at the position of the bearing element 3. This ensures that the optical element 1 maintains its alignment, already finely adjusted before the soldering process, during the soldering process.

In some configurations, the preform itself may also be designed as an elastic element. In this case, it is not necessary to equip the bearing element itself with resilient elements.

Figure 9:
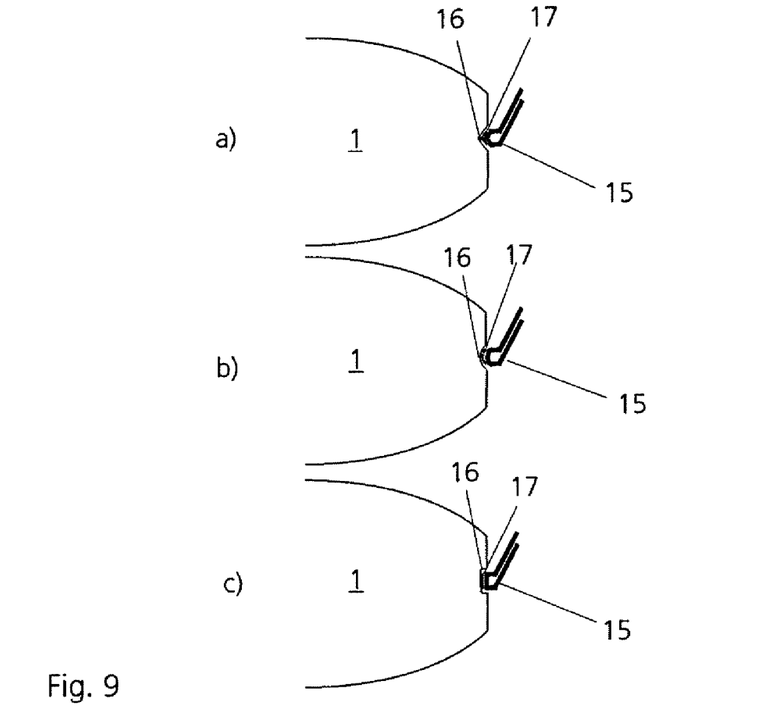
FIG. 9 shows an essentially form-fit connection between the optical element and the frame.

FIG. 9 shows an embodiment in which the optical element 1 has a recess 16 on its outside, into which a holding element 15 engages. The gap between the holding element 15 and the recess 16 may contain a filler material 17 for further stabilization of the connection. For example adhesives, solder or cement may in particular be envisaged as a filler material 17. The filler material 17 need not necessarily provide a material-fit connection—even a form-fit connection optimized by the filler material 17 is sufficient for a mechanically stable connection. Since there cannot be mechanical contact between the optical element 1 and the holding element 15 before the gap is filled with the filler material 17, the connection between the optical element 1 and the holding element 15 can take place essentially stress-free.

FIGS. 9a, 9b and 9c show various possibilities for the geometrical configuration of the recess 16 and the holding element 15; the holding element 15 is configured as a wedge in FIG. 9a, as a hemisphere in FIG. 9b and as a cuboid element in FIG. 9c. Of course, virtually any other geometrical shapes may be envisaged for producing the recess 16 and the holding element 15.

The type of loading of the connection represented can be adjusted within wide limits through the shaping of the holding element and the recess. In particular the distribution of compressive, tensile and shear loads in the filler material 17, which are due to the weight force of the optical element, may be distributed in an optimized way.

Figure 10:
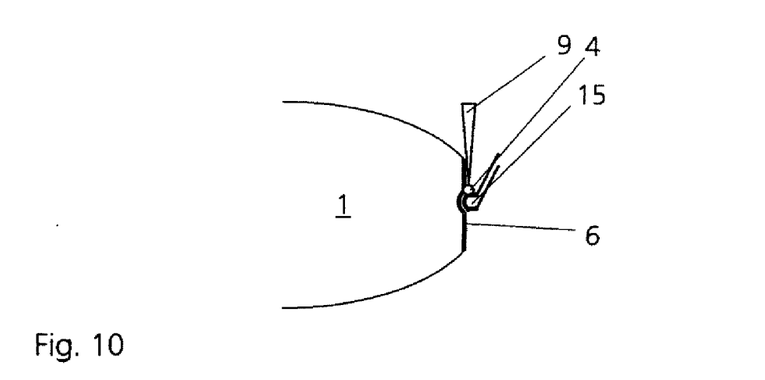
FIG. 10 solder is as a preform.

FIG. 10 shows a variant in which the solder is embodied as filler material 17, which is arranged as a spherical preform 4 in the region of the recess 16 and the holding element 15 and is melted by the focused laser beam 9. When the preform 4 melts, it fills the region between the optical element 1 embodied as a lens and the holding element 15, and therefore provides a firm material-fit connection after it has solidified. The adhesion of the solder to the material of the optical element 1 is improved by a metallization layer 6 being applied beforehand on the cylinder edge of the optical element 1 embodied as a lens. In addition or as an alternative, the holding element 15 may also be provided with a metallization 6 in the region of the recess 16. For the layer system of the metallization, Cr, W/Ti, Al may be envisaged as adhesion promoters, Ni, Pt, Cr, Ti as a solderable layer and Au, Pt as an oxidation protection layer. Owing to its low oxidizability, the layer sequence Cr/Ni/Au represents an advantageous selection. The layer system may in particular be produced via ion-assisted vacuum deposition (IAD, with electron beam evaporator—EBE); electrochemical coating methods may also be used.

The method described above is suitable in particular for initially connecting the holding elements 15 firmly to the optical element 1. In a subsequent step, the holding elements 15 may then be connected to the frame 2.

Figure 11:
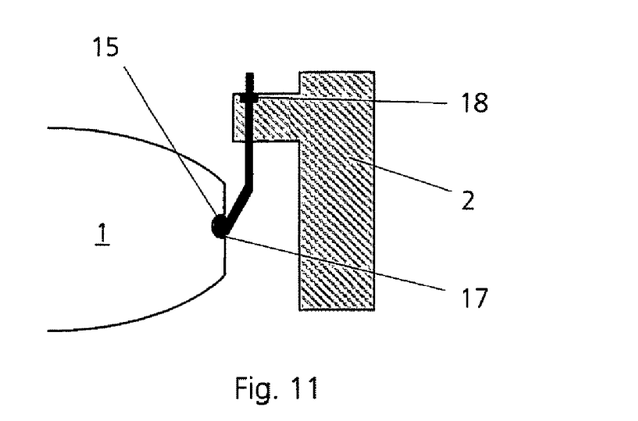
FIG. 11 shows an optical element connected to a frame via a holding element.

FIG. 11 shows an optical element 1 embodied as a lens, in the installed state in a frame 2. The optical element 1 embodied as a lens is firmly connected through the connection material 17 to the holding element 15, which is in turn firmly connected to the frame 2 through the for example soldered or welded frame connection position 18. The holding element 15 may in particular be introduced stress-free into the frame connection position 18 if a small gap remains between the holding element 15 and the frame connection position 18, which can subsequently be connected firmly to the frame 2 in a subsequent step via a welding or soldering method. The use of a soldering method can be desirable because this provides the opportunity to desolder the optical element 1 together with the holding elements 15 from the frame in a straightforward way at a later time.

Figure 12:
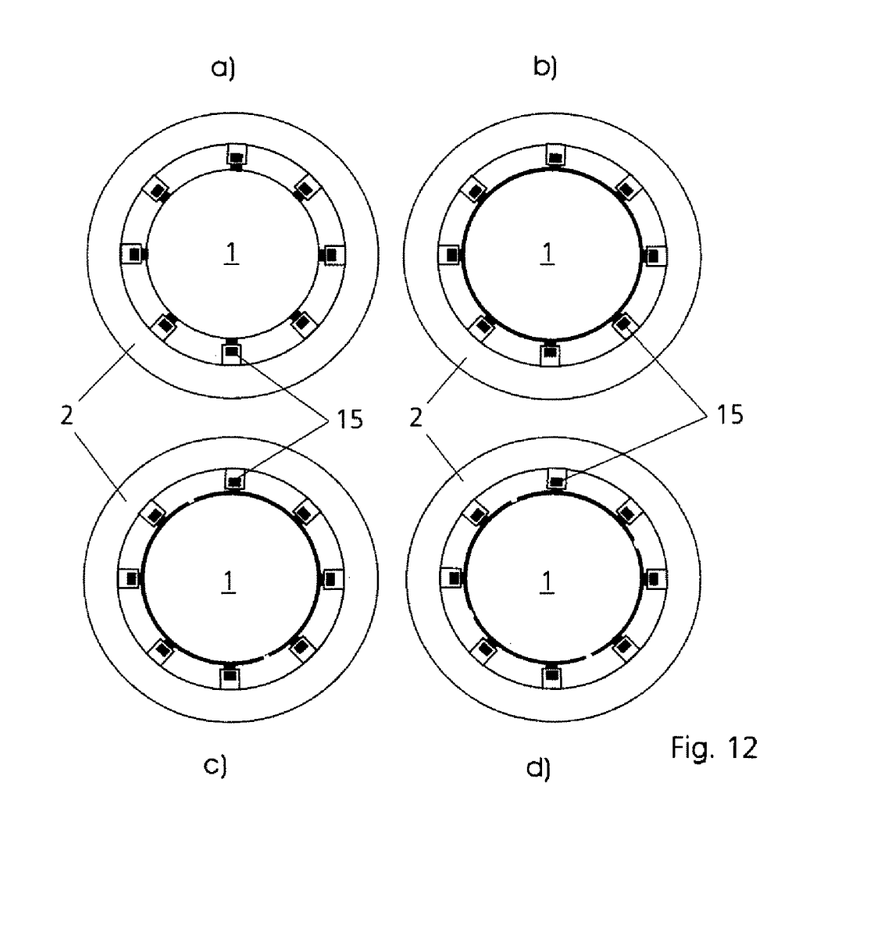

FIG. 12 shows various framing concepts in FIGS. 12a, 12b, 12c and 12d, which can be produced by the method described above. FIG. 12a describes an option in which the optical element 1 is only connected pointwise to the frame 2 through the holding element 15. Optionally, the holding elements 15 may also enclose the optical element 1 quasi-annularly along its entire circumference, so that particularly secure mounting of the optical element 1 in the frame 2 is ensured. This option is represented in FIG. 12b. Compromises between the two variants of FIGS. 12a and 12b are shown in FIGS. 12c and 12d; in these cases, the holding elements 15 do not fully encircle the optical element 1 on the sides facing it, rather they are produced as segments of differing extent. FIG. 12c shows a solution with two segments, while FIG. 12d represents a variant of the disclosure in which four segments are used, each of which is held in the frame 2 by two holding elements 15.

Figure 13:
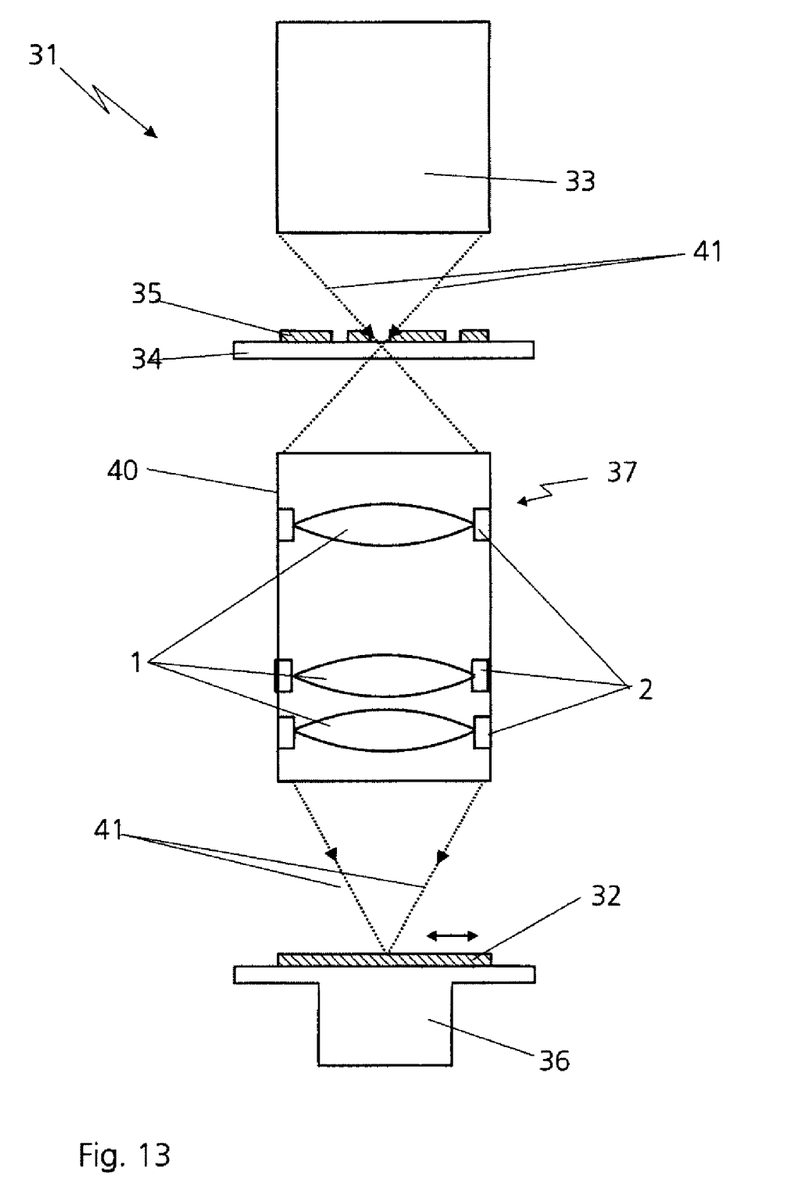
FIG. 13 shows a projection exposure apparatus for semiconductor lithography.

FIG. 13 represents a projection exposure apparatus semiconductor lithography 31, in which the disclosure is employed. The apparatus is used to expose structures on a substrate which is coated with photosensitive materials, which in general predominantly consists of silicon and is referred to as a wafer 32, for the production of semiconductor components, for example computer chips.

The projection exposure apparatus 31 consists essentially of an illumination instrument 33, an instrument 34 for receiving and exactly positioning a mask provided with a structure, i.e. a so-called reticle 35, by which the future structures on the wafer 32 are determined, an instrument 36 for holding, moving and exactly positioning this wafer 32 per se and an imaging instrument, i.e. a projection objective 37, having a plurality of optical elements 1 which are mounted via frames 2 in an objective housing 40 of the projection objective 37. The elements 1 framed may be arranged at any position in the projection objective 37; arrangement as a first or last optical element of the projection objective is suitable, since the most stringent desired properties for tightness and mechanical stability in respect of the framing technique exist at these positions. Optionally, the optical element 1 framed may also be arranged in the illumination instrument 33. In the projection exposure apparatus represented by way of example, all the methods presented above for arranging optical elements in frames may be employed, as well as all the described arrangements and devices.

The basic functional principle of the apparatus represented is that the structures introduced into the reticle 35 are imaged onto the wafer 32; the imaging is generally carried out on a reducing scale.

After exposure has been carried out, the wafer 32 is moved further in the arrow direction so that a multiplicity of individual fields are exposed on the same wafer 32, in each case with the structure dictated by the reticle 35. Owing to the stepwise forward movement of the wafer 32 in the projection exposure apparatus 31, the latter is often also referred to as a stepper.

The illumination instrument 33 provides a projection beam 41 which is desired for imaging the reticle 35 on the wafer 32, for example light or similar electromagnetic radiation. A laser or the like may be used as a source of this radiation. The radiation is shaped by optical elements in the illumination instrument 33 so that the projection beam 41 has the desired properties in respect of diameter, polarization, wavefront shape and the like when it strikes the reticle 35.

Via the beams 41, an image of the reticle 35 is generated and transferred, correspondingly reduced by the projection objective 37, onto the wafer 32 as already explained above. The projection objective 37 has a multiplicity of individual refractive, diffractive and/or reflective optical elements 38, for example lenses, mirrors, prisms, cover plates and the like.

The variants described above allow reversible, stress-free and material-fit connection of optical elements and frames. In particular, the described connections have a high creep stability; with them, it is possible to achieve position changes <100 nm and surface deformation changes <1 nm over several years. Fixing strengths in the range of >30 N/mm$^2$ can furthermore be achieved for optical elements with a wide variety of geometries having a diameter >200 mm. The properties can in particular be ensured even when there is a difference in the range of >10% between the thermal expansion coefficients of the frame and the optical element. The disclosure furthermore makes it possible for the stresses due to the material-fit connection in the optical element not to exceed a value of 1 MPa.

What is claimed is:

1. A method, comprising:
   providing an optical element within a frame, a metal layer being disposed between the optical element and the frame;
   melting only one component selected from the group consisting of the metal layer and the frame; and
   subsequently solidifying the component to connect the optical element with the frame,
   wherein, after solidifying the component, the optical element is not in direct contact with the frame, and
   wherein the component is the metal layer,
   wherein:
   the metal layer comprises an inner surface and an outer surface;
   the outer surface is between the inner surface and the frame;
   the method comprises melting the outer surface of the metal layer; and
   the inner surface of the metal layer is unmelted when the outer surface of the metal layer is melted.

2. The method of claim 1, wherein the metal layer has a diameter of about 0.1-1.5 mm.

3. The method of claim 1, wherein the metal layer has a thickness of about 0.3-2 mm.

4. The method of claim 1, comprising using a laser to melt the component.

5. The method of claim 1, wherein the metal layer is on an optically inactive surface of the optical element.

6. The method of claim 1, wherein the optical element and the frame are in mechanical contact with one another via at least three connection positions through non-molten regions of the metal layer during each instant of the melting and subsequent solidification of the metal layer.

7. The method of claim 1, wherein the optical element and the frame are in mechanical contact with one another via at least three connection positions that extend through regions of the molten metal during each instant of melting the metal.

8. A method, comprising:
providing an optical element within a frame, a material being between the optical element and the frame, the material comprising a metal; and
connecting the optical element with the frame by melting the material and subsequently solidifying the material,
wherein the material comprises an admixture to increase a mechanical stability of the connection of the optical element with the frame, and the admixture comprises at least one material selected from the group consisting of an oxide, a nitride, a boride and a carbide, and
wherein:
the material comprises an inner surface and an outer surface;
the outer surface is between the inner surface and the frame;
the method comprises melting the outer surface of the material; and
the inner surface of the material is unmelted when the outer surface of the material is melted.

9. The method of claim 8, wherein the admixture comprises a dispersoid.

10. The method of claim 8, wherein the admixture comprises a dispersoid comprising a zerodur powder.

11. The method of claim 8, wherein, after solidifying the material, the admixture comprises an intermetallic phase.

12. The method of claim 11, wherein the intermetallic phase comprises phosphorus.

13. The method of claim 8, wherein the admixture comprises at least one material selected from the group consisting of microfibers and nanotubes.

14. The method of claim 8, wherein the metal comprises a metal selected from the group consisting of tin, bismuth, antimony, indium, gold, silver and palladium.

15. The method of claim 8, wherein the material comprises a solder.

16. The method of claim 8, wherein the optical element and the frame are in mechanical contact with one another via at least three connection positions through non-molten regions of the material during each instant of the local melting and subsequent solidification of the material.

17. The method of claim 8, wherein, after solidifying the material, the optical element is not in direct contact with the frame.

18. The method of claim 8, wherein the optical element and the frame are in mechanical contact with one another via at least three connection positions that extend through regions of the molten metal during each instant of melting the metal.

19. A method, comprising:
providing an optical element within a frame, a metal layer being between the optical element and the frame;
using a laser to melt the metal layer and the frame; and
subsequently solidifying the metal layer and the frame to connect the optical element with the frame,
wherein:
the optical element and the frame are in mechanical contact with one another via at least three connection positions through non-molten regions of the metal layer and the frame during each instant of the local melting and subsequent solidification of the material; and
after solidifying the metal layer and the frame, the optical element is not in direct contact with the frame; and
wherein:
the metal layer comprises an inner surface and an outer surface;
the outer surface is between the inner surface and the frame;
the method comprises melting the outer surface of the metal layer; and
the inner surface of the metal layer is unmelted when the outer surface of the material is melted.

20. The method of claim 19, wherein the metal layer comprises a flux-free material.

21. The method of claim 19, wherein melting and solidifying are performed without forming an oxide.

22. The method of claim 19, wherein the optical element and the frame are in mechanical contact with one another via at least three connection positions that extend through regions of the molten metal during each instant of melting the metal.

* * * * *

UNITED STATES PATENT AND TRADEMARK OFFICE
CERTIFICATE OF CORRECTION

PATENT NO.         : 9,604,299 B2
APPLICATION NO.    : 14/199044
DATED              : March 28, 2017
INVENTOR(S)        : Armin Schoeppach et al.

It is certified that error appears in the above-identified patent and that said Letters Patent is hereby corrected as shown below:

On the Title Page

Column 1, Line 2 under "Inventors:", delete "Johnannes" and insert -- Johannes --.

Page 2, Column 1, Line 12 under "References Cited", delete "Steegmuller" and insert -- Steegmueller --.

Page 2, Column 2, Line 10 under "FOREIGN PATENT DOCUMENTS", delete "02475" and insert -- 024755 --.

Page 2, Column 2, Line 11 under "FOREIGN PATENT DOCUMENTS", delete "03809" and insert -- 038093 --.

Page 2, Column 2, Line 12 under "FOREIGN PATENT DOCUMENTS", delete "03654" and insert -- 036547 --.

In the Specification

Column 8, Line 50, delete "FIG." and insert -- FIGS. --.

Column 8, Line 50, delete "elements," and insert -- elements; --.

Signed and Sealed this
Eighth Day of August, 2017

Joseph Matal
*Performing the Functions and Duties of the*
*Under Secretary of Commerce for Intellectual Property and*
*Director of the United States Patent and Trademark Office*